(12) United States Patent
Oishi

(10) Patent No.: US 8,976,337 B2
(45) Date of Patent: Mar. 10, 2015

(54) METHOD OF MEASURING MARK POSITION AND MEASURING APPARATUS

(75) Inventor: Satoru Oishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 776 days.

(21) Appl. No.: 13/210,003

(22) Filed: Aug. 15, 2011

(65) Prior Publication Data

US 2012/0050710 A1 Mar. 1, 2012

(30) Foreign Application Priority Data

Aug. 24, 2010 (JP) ................................ 2010-187128

(51) Int. Cl.
*G03F 9/00* (2006.01)
*G03B 27/52* (2006.01)
*G03B 27/53* (2006.01)

(52) U.S. Cl.
CPC ............ *G03F 9/7092* (2013.01); *G03B 27/521* (2013.01); *G03B 27/53* (2013.01)
USPC .............. 355/77; 356/399; 356/400; 356/401

(58) Field of Classification Search
CPC ......... G03B 2205/00; G03F 9/00; G03F 9/70; G03F 2009/00
USPC .......................... 355/72, 53, 77; 356/399–401
See application file for complete search history.

(56) References Cited

U.S. PATENT DOCUMENTS

2007/0146708 A1* 6/2007 Hagiwara ..................... 356/401
2008/0013090 A1* 1/2008 Hagiwara ..................... 356/400

FOREIGN PATENT DOCUMENTS

JP 2004-117030 A 4/2004
JP 2004-281904 A 10/2004

* cited by examiner

*Primary Examiner* — Peter B Kim
*Assistant Examiner* — Michelle Iacoletti
(74) *Attorney, Agent, or Firm* — Canon USA, Inc. IP Division

(57) ABSTRACT

A method and an apparatus are provided to measure a position of a mark with a less measurement error caused by a variation in a wafer process condition. The mark is illuminated with light and an image of the mark is formed, via an optical system, in a light receiving surface of a sensor. The image of the mark is sensed and image data thereof is acquired by the sensor. Correction data of a fundamental frequency and a high harmonic of the image data is set based on information associated with a shape of the mark, an imaging magnification of the optical system, and an imaging area of the sensor. The image data is corrected using the correction data, and the position of the mark is calculated using the corrected image data.

12 Claims, 19 Drawing Sheets

POSITION MEASUREMENT DIRECTION

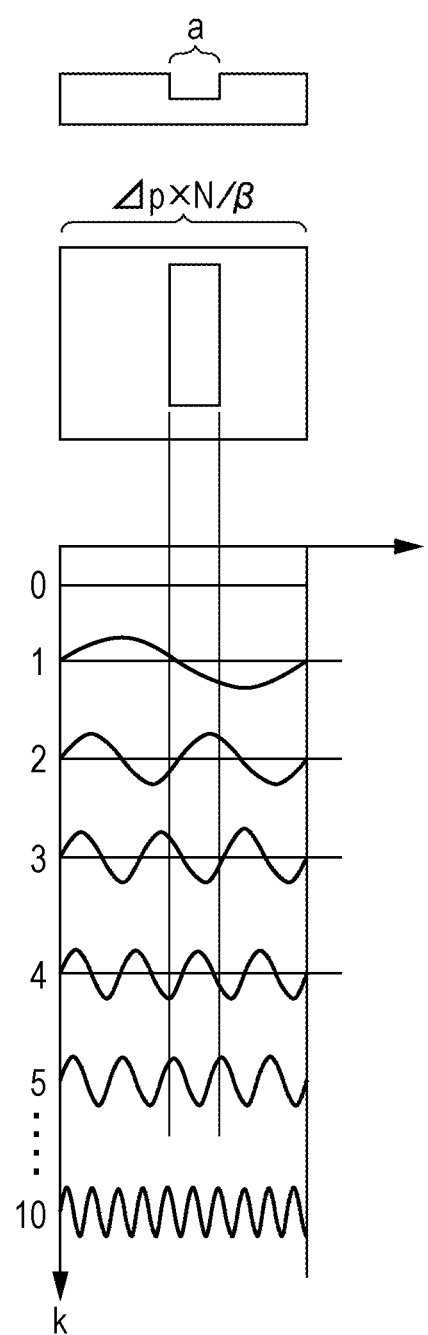

POSITION
MEASUREMENT
DIRECTION

METHOD OF MEASURING MARK POSITION AND MEASURING APPARATUS

BACKGROUND OF THE INVENTION

1. Field of the Invention

The present invention relates to a method of measuring a mark position and a measuring apparatus.

2. Description of the Related Art

An exposure apparatus projects a pattern image of a reticle onto a resist coated on a wafer thereby exposing the resist. To achieve high accuracy of the position where the reticle pattern is projected, it is important to achieve high accuracy in relative alignment between the reticle and the wafer.

A mark (alignment mark) used in the alignment is formed together with the reticle pattern on the wafer by an expose-and-transfer process. A plurality of alignment marks located in predetermined shots are detected using an optical system, and an array of all shots is calculated based on positions of the detected marks, and alignment is performed based on a calculation result.

The alignment marks can vary in shape among wafers and among shots. This can cause a position detection error (hereinafter also called a WIS (Wafer Induced Shift)) due to a variation in a wafer process condition to occur in a mark position detection process, which in turn can cause a reduction in alignment accuracy. Japanese Patent Laid-Open No. 2004-117030 discloses a technique of reducing the WIS by performing offset calibration. The offset calibration is a process of calculating the shift of the position of the alignment mark actually detected by the detection system from the true position and correcting the detected position based on the calculated shift.

Japanese Patent Laid-Open No. 2004-281904 discloses a technique of correcting the mark position detection. In this technique, a transfer characteristic of an optical system is determined in advance, and image data of an alignment mark is corrected (reconstructed) using an inverse function of the transfer characteristic of the optical system. Note that an error caused by an apparatus (tool induced shift (Tool Induced Shift)), which will be described later, is one of errors caused by the transfer characteristic of the optical system.

The WIS is not the only cause of the position detection error, but there can be other causes. An example is an error produced by an exposure apparatus (mark detection optical system). Such an error is generically called a tool induced shift (TIS). Another example is an error produced by an interaction between TIS and WIS (TIS-WIS interaction), which can cause a reduction in alignment accuracy. Factors that can cause the WIS include a height of a step (a depth of a recess) of the alignment mark, asymmetricity of the alignment mark, and nonuniformity of resist coated on a wafer. Aberration of the mark detection optical system can be a factor of the TIS.

It is difficult to eliminate TIS perfectly. Therefore, when there is a WIS (such as an error caused by a low step height of a mark, nonuniformity of a resist coated on a wafer, etc.), a TIS-WIS interaction can make it difficult to achieve high accuracy in detection of an alignment mark position. Even when the same optical system is used, the presence of a TIS can cause a greater position detection error to occur for an alignment mark with a smaller step height than for an alignment mark with a larger step height.

In the technique disclosed in Japanese Patent Laid-Open No. 2004-281904, it is assumed that the transfer characteristic of the optical system is used in the correction. However, in practice, it is difficult to accurately measure the transfer characteristic of the optical system, and a measurement error can cause a reduction in accuracy in reconstruction of image data of the alignment mark. Besides, even if the influence of the TIS can be reduced, this does not necessarily result in a reduction in influences of variations in wafer process conditions such as a variation in the step height of the alignment mark, a variation in resist thickness, etc.

In view of the above, the present invention provides a method and an apparatus for measuring a mark position with a less measurement error caused by variations in wafer process conditions.

SUMMARY OF THE INVENTION

In an aspect, the present invention provides a method including acquiring data of an image of a mark formed on substrate by sensing the image of the mark by a sensor and an imaging optical system, setting correction data of a fundamental frequency and a high harmonic of the data based on information associated with a shape of the mark, an imaging magnification of the imaging optical system, and an imaging area of the sensor, correcting the data based on the correction data, and calculating a position of the mark based on the corrected data.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a diagram illustrating a fundamental frequency and harmonic components.

DESCRIPTION OF THE EMBODIMENTS

Embodiments of the present invention will now be described in detail in accordance with the accompanying drawings.

First Embodiment

Figure 1:
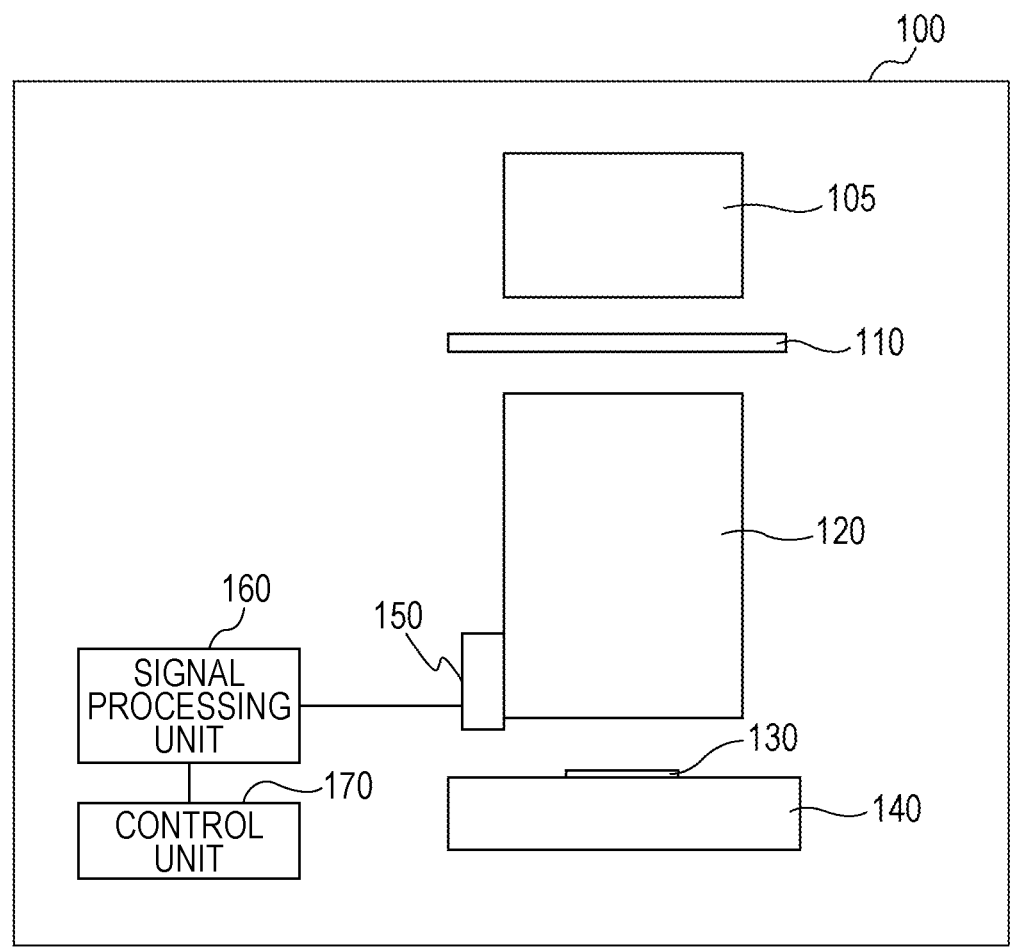
FIG. 1 is a block diagram schematically illustrating an exposure apparatus.

FIG. 1 is a block diagram schematically illustrating an exposure apparatus 100. The exposure apparatus 100 illuminates a reticle (mask) 110 using an illumination optical system 105 and projects an image of a reticle pattern onto a resist coated on a wafer (substrate) 130 via a projection optical system 120 thereby performing exposure of the wafer 130.

The exposure apparatus 100 includes a wafer stage (substrate stage) 140 for holding a wafer and moving it, a mark detection system 150 for detecting an alignment mark, a signal processing unit 160 that acquires an output signal from the mark detection system 150 and performs an operation process on the acquired signal, and a control unit 170. The wafer has an underlying pattern and an alignment mark 180 (see FIG. 2) formed in a previous processing step. The wafer is held by a wafer chuck disposed on the wafer stage and the wafer is positioned at a specified position by the wafer stage.

The mark detection system 150 includes an imaging optical system that forms, in an imaging plane, an image of an area including the to-be-detected alignment mark 180 on the wafer 130. Note that the illumination optical system 105 illuminates the reticle 110 using light emitted from a light source that is not shown in the figure.

The control unit 170 includes a CPU (central processing unit) and a memory, and controls various parts of the exposure apparatus 100. The control unit 170 is electrically connected to the illumination optical system 105, a reticle stage (not shown) configured to hold the reticle 110, the wafer stage 140, and the signal processing unit 160. The control unit 170 controls the wafer stage 140 based on position information associated with the alignment mark supplied from the signal processing unit 160 such that the wafer 130 is positioned properly.

Figure 2:
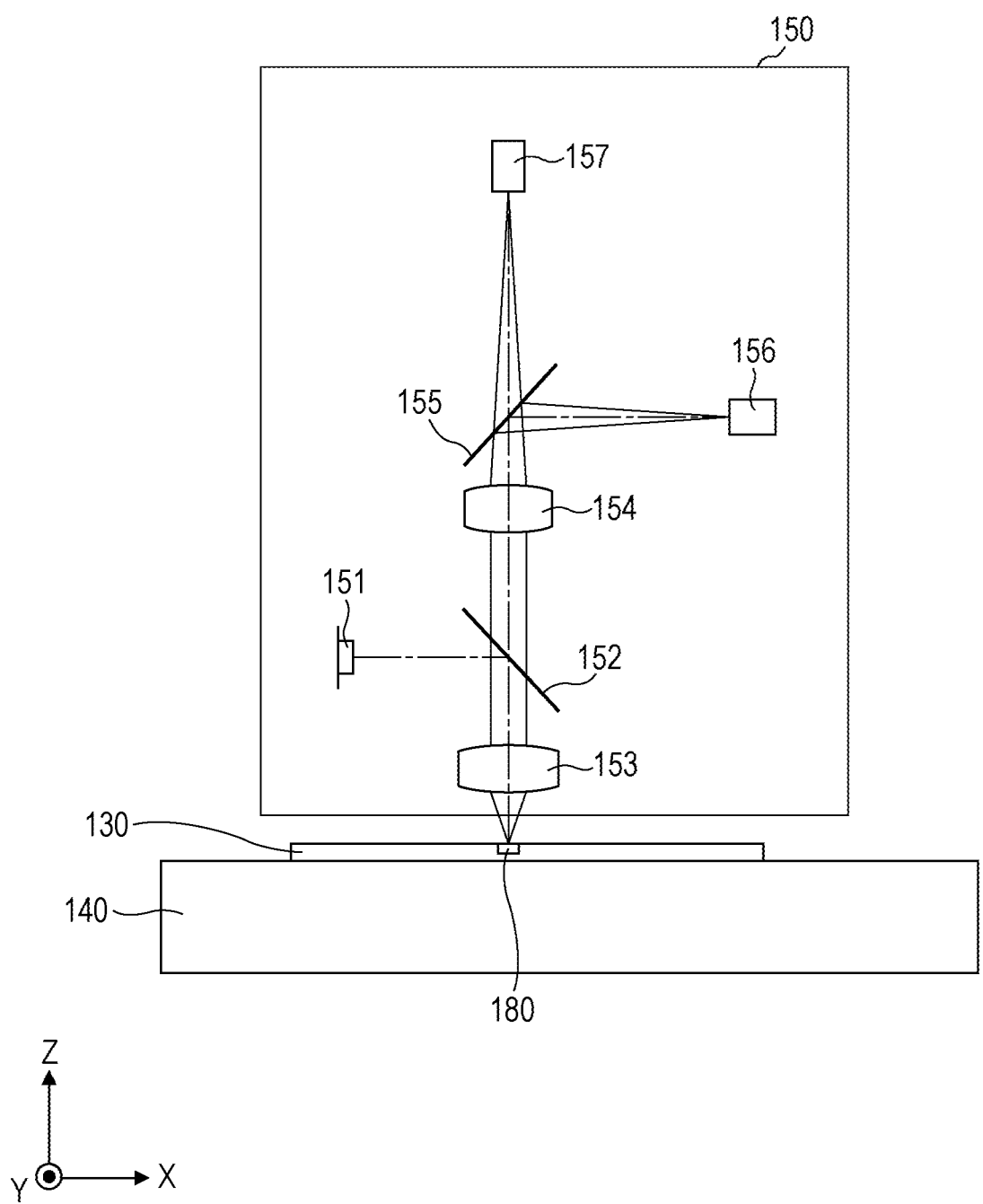
FIG. 2 is a schematic diagram illustrating a mark detection system.

Next, a principle of detecting the alignment mark 180 is described below. FIG. 2 illustrates main constituent elements of the mark detection system 150. In FIG. 2, illumination light emitted from a light source 151 is reflected by a beam splitter 152, passes through an objective lens 153, and finally illuminates the alignment mark 180 on the wafer 130. Light (reflected light, diffracted light, and the like) from the alignment mark 180 passes through the objective lens 153, the beam splitter 152 and a lens 154 and reaches a beam splitter 155. At the beam splitter 155, the light is split into two beams, which are respectively received by sensors such as CCDs (image sensor, photosensor element) 156 and 157. The elements 152 to 155 described above form an imaging optical system that forms the image of the alignment mark located on the wafer 130 in a light receiving surface of the sensors in the imaging plane.

Thus, the image of the alignment mark 180 is magnified by a factor of about 300 by the lenses 153 and 154 and formed in the light receiving surfaces of the respective sensors 156 and 157. The sensors 156 and 157 are sensors for measuring position shifts in X and Y directions of the alignment mark 180.

The sensors 156 and 157 may be realized using line sensors. In this case, a cylindrical lens having power only in a direction perpendicular to a measurement direction may be used to focus light in the direction perpendicular to the measurement direction thereby optically integrating (averaging) the light. The detection principle is the same for the X and Y direction, and thus only the position measuring in the X direction is described below.

Figure 3A:
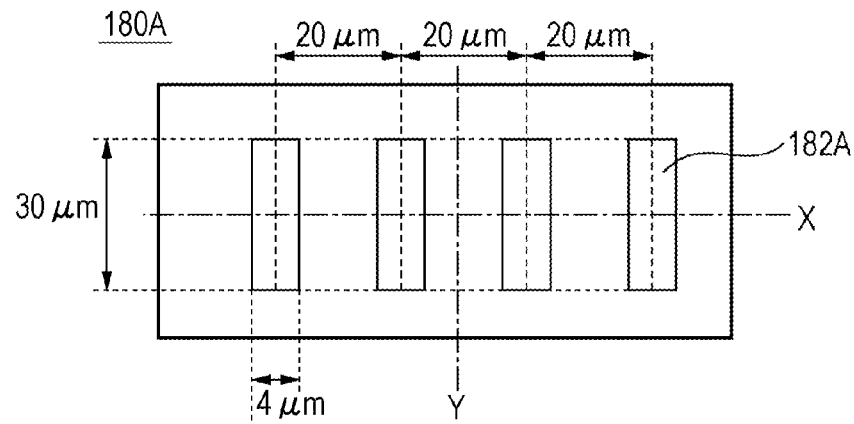
FIG. 3A is a plan view of an alignment mark.
Figure 3B:
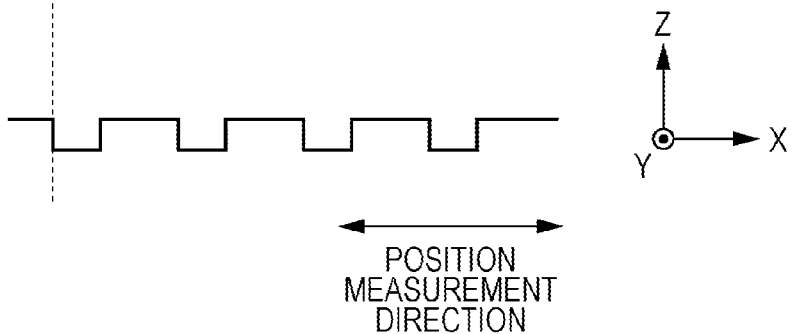
FIG. 3B is a cross-sectional view of the alignment mark.

One alignment mark 180 is disposed on a scribe line of each shot. For example, the alignment mark 180A may be formed in a shape such as that shown in FIGS. 3A and 3B. FIG. 3A is a plan view and FIG. 3B is a cross-sectional view of the alignment mark 180A. Practically, a resist is coated over the alignment mark 180A, although it is not shown in FIGS. 3A and 3B.

As shown in FIG. 3A, the alignment mark 180A includes four rectangular mark elements 182A each having a length of 4 μm in an X direction (measurement direction) and a length of 30 μm in a Y direction, which are arranged in the X direction at a constant pitch of 20 μm. Each mark element 182A has a recessed structure in cross section as shown in FIG. 3B.

Figure 3C:
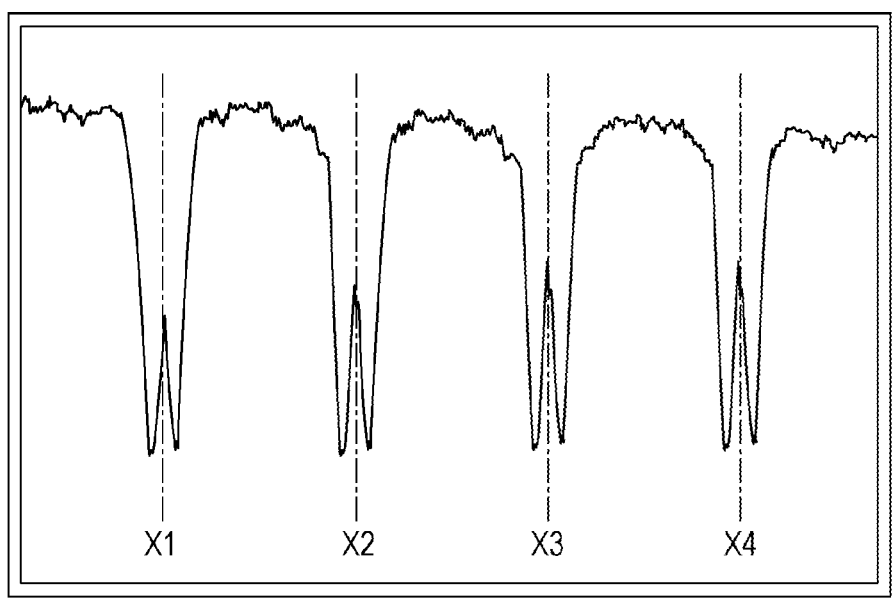
FIG. 3C illustrates a detection signal.

FIG. 3C is a graph representing a result (light intensity distribution) obtained by optically detecting an alignment mark such as that shown in FIGS. 3A and 3B by the mark detection system 150. In general, high frequency components at edges of the alignment mark are cut off. This occurs because light is scatted at edges at large angles exceeding the NA of lenses 153 and 154 of the mark detection system 150 and thus the whole light from the alignment mark does not pass through the mark detection system 150. As a result, the mark detection system 150 inevitably has degradation in the mark information and more specifically the mark detection system 150 has a loss of high frequency components.

Figure 4:
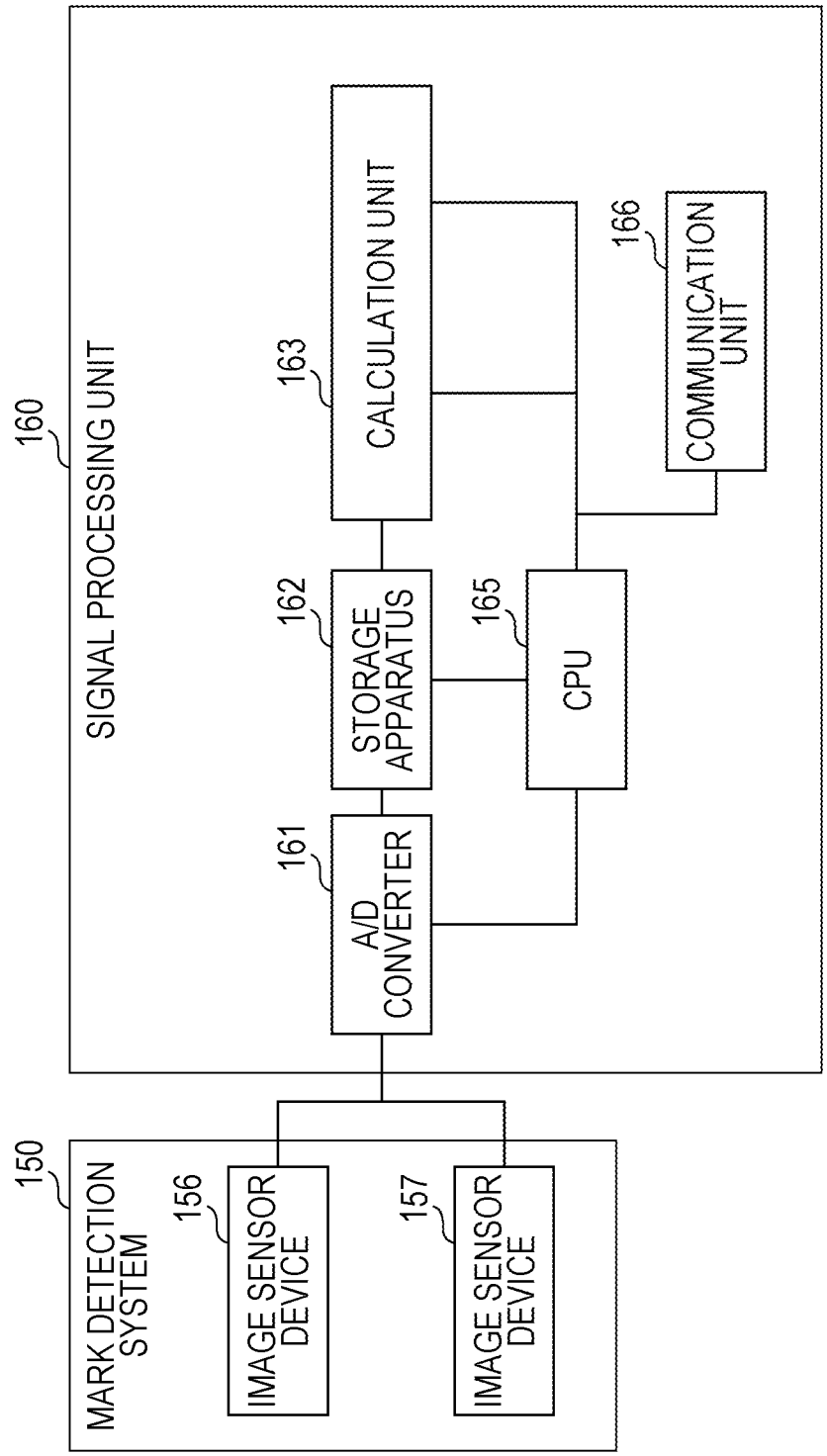
FIG. 4 is a block diagram illustrating main functional modules in a signal processing unit.

FIG. 4 is a block diagram illustrating main modules included in the signal processing unit 160. The mark detection system 150 including the sensors (156 and 157) and the imaging optical system (153 to 155) and the signal processing unit 160 form a detection apparatus that detects the position of the alignment mark.

Analog image data (detection signal) obtained by detecting the alignment mark 180 by the sensors 156 and 157 is sent to an analog-to-digital converter 161 of the signal processing unit 160 and converted into a digital signal. The resultant digital signal is stored in a storage apparatus (storage unit) 162 such as a memory. The calculation unit 163 performs a correction (reconstruction of the detection signal) on the digital image data stored in the storage apparatus 162 using a method described later, and performs digital signal processing on the corrected image data to detect the position of the alignment mark. The CPU 165 is connected to the analog-to-digital converter 161, the storage apparatus 162, and the calculation unit 163, and the CPU 165 outputs control signals to control these units. A communication unit 166 communicates with the control unit 170 shown in FIG. 1 to receive/transmit necessary data, a control command, etc., from/to the control unit 170.

The calculation unit 163 may perform the signal processing using many methods such as a method of detecting an edge of an image and calculating the position of the detected edge, a method based on pattern matching using a template, a method based on symmetric matching, etc.

The sensors 156 and 157 may be of a 2-dimensional type or a 1-dimensional type. In any case, the alignment mark is measured independently in the X direction and the Y direction, and the signal processing is performed one-dimensionally. Therefore, in the case where two-dimensional sensors are used as the sensors 156 and 157, the two-dimensional signals obtained by the mark detection system 150 are integrated in the position measurement direction and such that they are averaged. After the two-dimensional signals are converted into one-dimensional line signals in the above-described manner, the signal reconstruction is performed. The unit that performs the signal reconstruction and the mark position calculation is not limited to the calculation unit 163, but other apparatuses may be used. For example, a software program stored in a storage medium may be installed onto a computer disposed outside the exposure apparatus, and the computer may perform the signal reconstruction and the mark position calculation by executing the software program.

Figure 5:
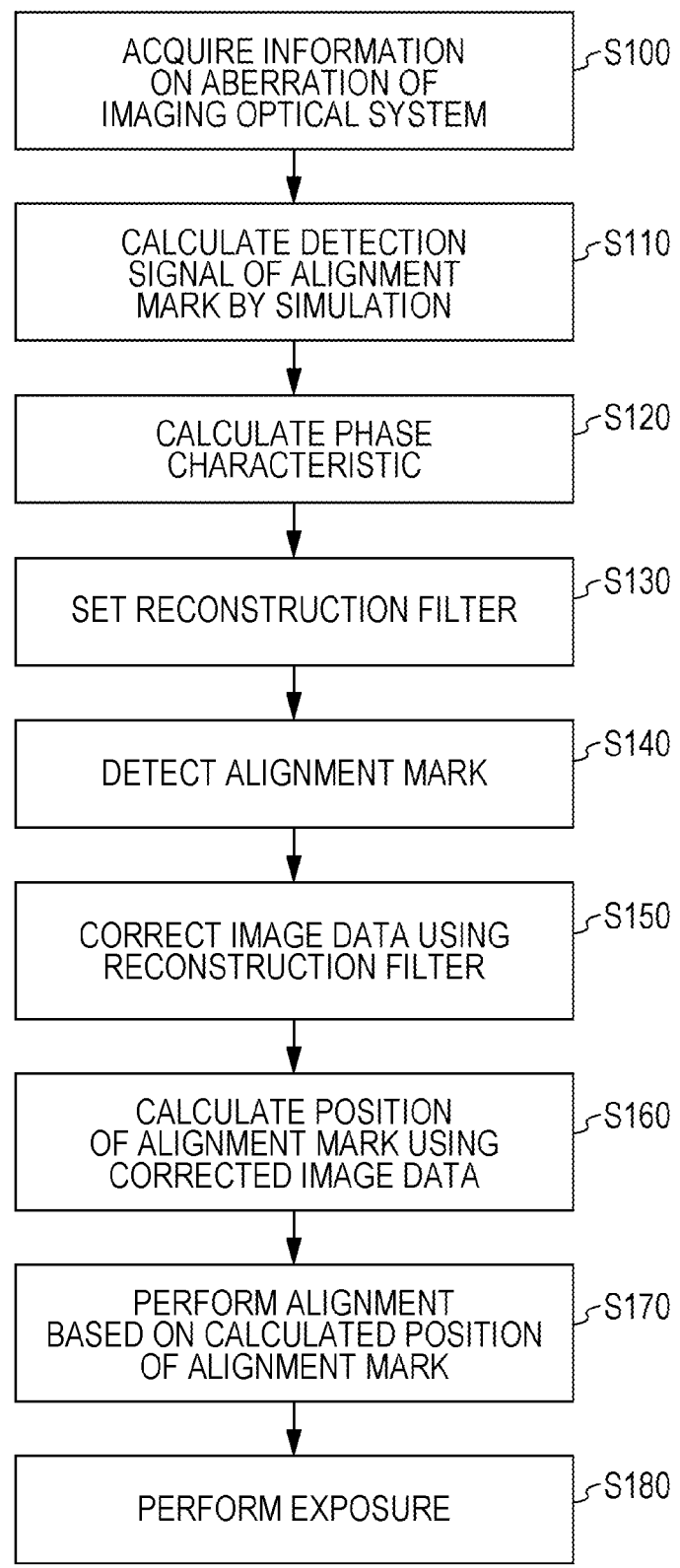
FIG. 5 is a flow chart illustrating signal processing performed by a signal processing unit.

The signal processing performed by the signal processing unit 160 is described below with reference to a flow chart shown in FIG. 5.

First, information about aberration of the imaging optical system of the mark detection system 150 in the exposure apparatus is acquired (step S100). The acquisition may be performed by reading the aberration information stored in the storage apparatus 162 or measured aberration data may be directly acquired from an external apparatus. The aberration information include information associated with various types of aberrations of the imaging optical system, such as a coma aberration, a spherical aberration, etc. For example, in the case of the coma aberration, the coma aberration information includes a design value and a manufacturing error, and thus complete coma aberration information including the design value and the manufacturing error can be determined by measuring the manufacturing error. In addition to the coma aberration information, other information to be used in the signal simulation in step S110 (described later), such as information indicating the degree of uniformity of illumination light, chromatic aberration, is also acquired in advance in a similar manner to the coma aberration information.

Next, simulation is performed to calculate the image data of a plurality of alignment marks (step S110). The simulation is performed based on given information associated with a size a of the alignment mark in the measurement direction, a measurement pitch $\Delta p$, the number of pixels to be measured (imaging area), NA of the imaging optical system of the mark detection system, $\sigma$ of the illumination system, an illumination light wavelength $\lambda$, and the aberration information acquired in step 100. The simulation is performed for each of different values of a wafer process parameter of interest such as different step heights (recess depths) of the alignment mark, taking into account form birefringence thereby obtaining a plurality of pieces of simulated image data of the alignment mark corresponding to the different parameter values.

In the present embodiment, by way of example, two values (d1 and d2) of the step height are selected as values of the wafer process parameter. More specifically, for example, when a standard value of the step height is given as d0 and if the step height can vary by $\Delta d$ (for example, 50 nm) around the standard value due to a variation in wafer process condition, then d1 and d2 may be set as follows.

$$\begin{cases} d1 = d0 - \Delta d \\ d1 = d0 + \Delta d \end{cases} \quad (1)$$

Depending on a situation, the standard value of the height of the mark step is not given, or no information is available as to the range within which the height of the mark step can vary depending on the wafer process condition. In such a case, d1 and d2 may be given by a combination of values that result in a great difference in shift (from the mark center) of the signal obtained by the sensor due to the coma aberration of the imaging optical system. This setting is based on the fact that the reduction in the variation by the signal processing according to the present embodiment of the invention is more useful for a case where a large shift occurs due to a variation in height of the mark step than for a case where only a small shift occurs. That is, the present embodiment of the invention is useful to enhance the robustness against the process conditions.

Figure 6:
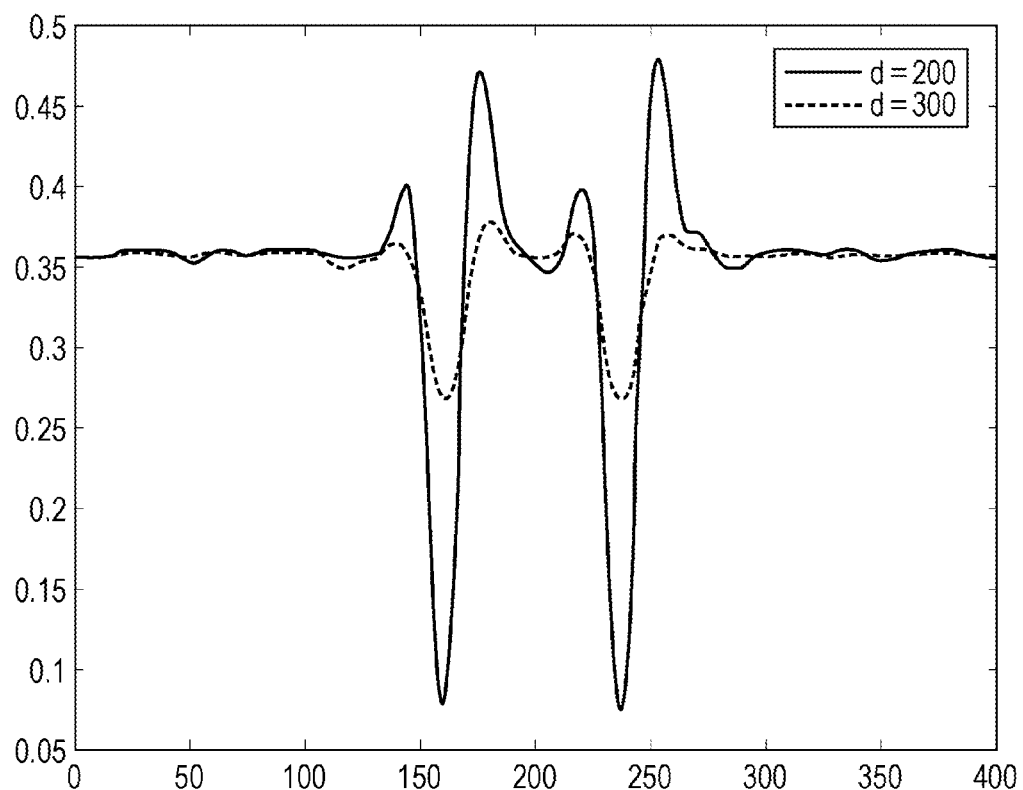
FIG. 6 illustrates examples of simulated image data of two marks with different step heights.

In general, in the case of the coma aberration, a signal obtained for a low light-intensity contrast results in a greater shift than that resulted from a signal obtained for a high light-intensity contrast. Therefore, d1 and d2 may be given by a combination of a mark with a low contrast and a mark with a high contrast, which results in a large difference in shift. A mark step with a low contrast occurs, for example, when d=$\lambda$/2 where $\lambda$ denotes the wavelength of illumination light. In the calculation described below, parameters are assumed, by way of example, as follows. The wavelength of illumination light is assumed such that $\lambda$=600 nm, the mark step with a high contrast is assumed such that d1=200 nm, and the mark step with a low contrast is assumed such that d2=300 nm. FIG. 6 illustrates an example of a result of simulation of image data for an alignment mark with a mark step of d1=200 nm and also for that with mark step of d2=300 nm.

Next, from the simulated signals obtained for the plurality of different alignment marks, a calculation is performed to determine the difference in phase characteristic depending on the wafer process conditions (the difference in phase characteristic among the process conditions) (step S120). More specifically, the simulated detection signals obtained for the two mark steps d1 and d2, such as those shown in FIG. 6, are Fourier-transformed and the phase characteristics at a fundamental frequency (fundamental wave) and harmonic components are calculated as described below.

Note that the spectrum of the simulated detection signal has a harmonic structure including a fundamental frequency and harmonic components. The present invention is based on knowledge, obtained by the present inventors, that the fundamental frequency is determined by the shape of the alignment mark.

The fundamental frequency and the harmonic components are described in further detail below with reference to FIG. 7. In the alignment mark shown in FIG. 3A, let parameters thereof be denoted such that the line width (the length in the x direction) of the mark element 182A is denoted by a, the imaging magnification of the imaging optical system is denoted by $\beta$, the pixel pitch of the sensor is denoted by $\Delta p$, and the number of pixels in the x direction in an imaging area is denoted by N. Of discretized image data f(k) (k=0, ..., N−1), discrete data (k=k1) corresponding to the fundamental frequency can be determined according to equation (2).

$$k_1 = \Delta p \times N/(\beta \cdot \alpha) \quad (2)$$

The right-hand side of equation (2) takes a real number, and thus the real number is rounded into an integer to determine the value of $k_1$. The value of $k_1$ determined by equation (2) is employed as a fundamental frequency, and high harmonics are given by multiplying the fundamental frequency by integers equal to or greater than 2 (FIG. 7). Hereinafter, the fundamental frequency and the associated harmonic components will be generically referred to as harmonic frequencies.

Figure 8A:
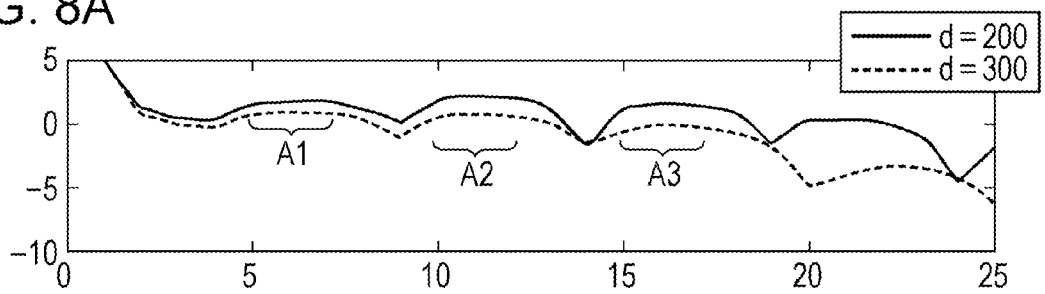
FIG. 8A illustrates an amplitude characteristic of a Fourier transform of a simulated detection signal.
Figure 8B:
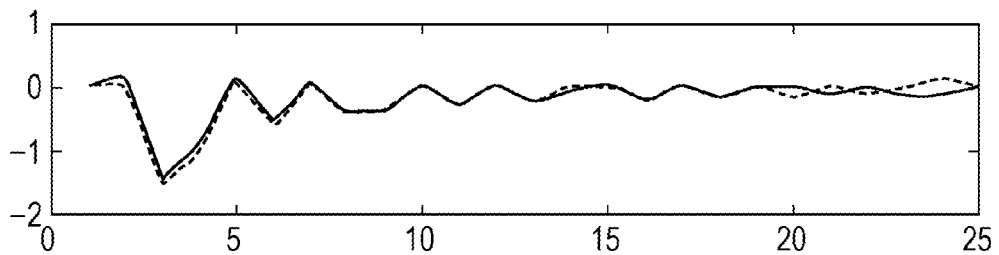
FIG. 8B illustrates a phase characteristic of the Fourier transform of the simulated detection signal.

It has been found out that a great change in phase characteristic occurs at some particular harmonic frequencies while only a small change occurs at some particular harmonic frequencies. The phase characteristics at the respective harmonic frequencies can vary depending on the wafer process conditions, and the magnitudes of variations depend on the frequencies. FIGS. 8A to 8D illustrate examples of Fourier transforms of simulated detection signals of two mark steps. FIG. 8A illustrates the amplitude characteristic of the Fourier-transform of the simulated detection signal, and FIG. 8B illustrates the phase characteristic thereof.

The phase characteristics at harmonic frequencies may be given by the phase characteristics at spectral peaks corresponding to the harmonic frequencies or may be given by the averages of the phase characteristics at a plurality of points around the peaks. For example, in FIG. 8A, the averages of the phase characteristics at a plurality of points in respective zones A1, A2, and A3 around the harmonic frequencies may be calculated and the resultant values may be employed as the phase characteristics at the corresponding harmonic frequencies. In the example shown in FIGS. 8A and 8B, the spectrum has large amplitudes close to harmonic frequencies corresponding to A1, A2, and A3, which means that a change in phase characteristic occurs due to the mark step. A1 corresponding to the fundamental frequency is referred to as the first-order harmonic frequency band, A2 corresponding to the second-order harmonic frequency is referred to as the second-order harmonic frequency band, A3 corresponding to the third-order harmonic frequency is referred to as the third-order harmonic frequency band, and so on.

Next, correction data (reconstruction filter) is set based on the difference in phase characteristic at each harmonic frequency (step S130). Thereafter, an actual alignment mark is detected (step S140), and the calculation unit 163 corrects (reconstructs) the image data using the correction data set in step S130 (step S150).

Figure 8C:
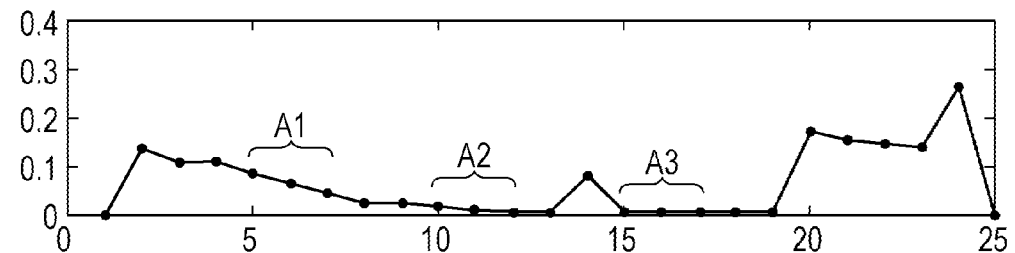
FIG. 8C illustrates a difference (phase difference) in phase characteristic.
Figure 8D:
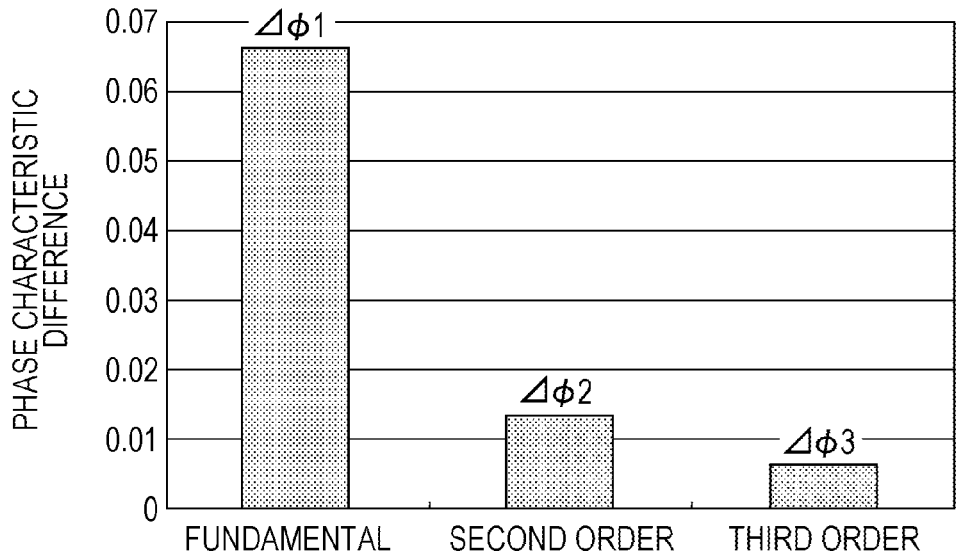
FIG. 8D illustrates the average differences in phase characteristic.

The actual image data (FIG. 3C) includes signals associated with a plurality of mark elements, and thus the reconstruction is performed on each mark element. In the following description, an explanation is given as to the signal reconstruction of one of those mark elements. FIG. 8C illustrates the difference in the phase characteristic (the phase difference) between the mark step height of 200 nm and the mark step height of 300 nm shown in FIG. 8B. As can be seen, the difference in phase characteristic is small at the third-order harmonic frequency compared with those at the first-order and second-order harmonic frequencies. In FIG. 8C, if the difference in phase characteristic is averaged in each of the bands A1, A2, and A3, then the result is as shown in FIG. 8D. Because the difference in phase characteristic at the third-order harmonic frequency band is smaller than at the other harmonic frequency bands, emphasis may be put on the amplitude characteristic at the third-order harmonic frequency band.

Figure 9A:
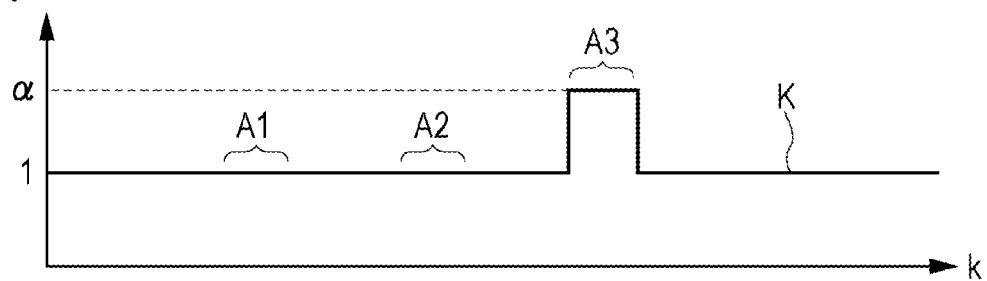
FIGS. 9A, 9B, and 9C illustrate examples of reconstruction filters.

More specifically, for example, the reconstruction filter K may be set to be magnified by a factor $\alpha$ (>1) at the third-order harmonic frequency band as shown in FIG. 9A, and the spectrum of the image data is corrected using the reconstruction filter K according to the following equation (3).

$$F' = G*K \quad (3)$$

Furthermore, a reconstructed signal f' is calculated according to equation (4).

$$f' = FT^{-1}(G*K) \quad (4)$$

where K denotes the reconstruction filter, G denotes the Fourier transform of the image data, F' denotes the Fourier transform of the reconstructed image data, and $FT^{-1}$ is the inverse Fourier transform.

Figure 9B:
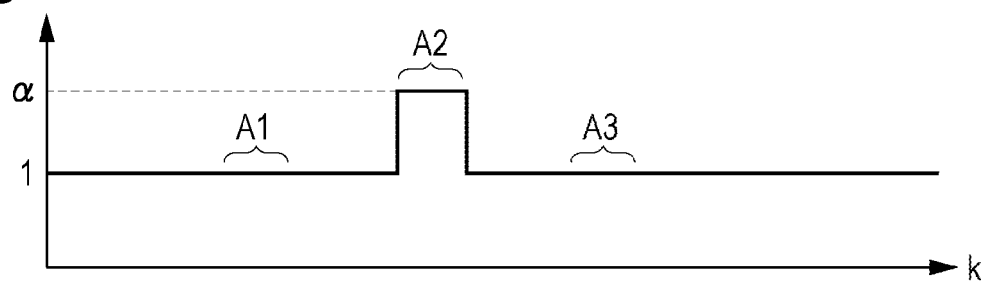
Figure 9C:
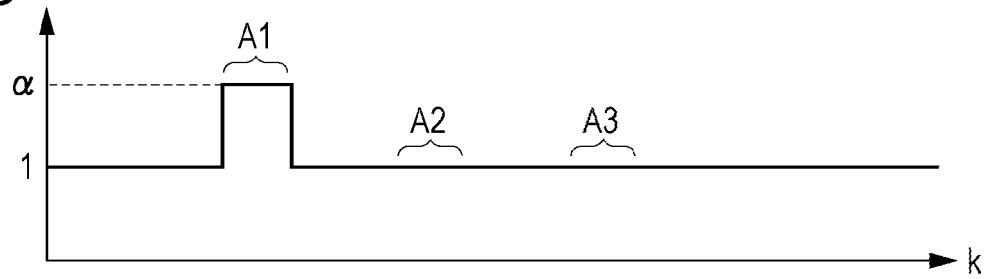

In the example described above, the difference in phase characteristic is the least at the third-order harmonic frequency band. In a case where the difference in phase characteristic is the least at the second-order harmonic frequency band, a factor $\alpha$ (>1) may be set at the second-order harmonic frequency band as shown in FIG. 9B. In a case where the difference in phase characteristic is the least at the first-order harmonic frequency band, a factor $\alpha$ (>1) may be set at the first-order harmonic frequency band as shown in FIG. 9C.

Figure 10A:
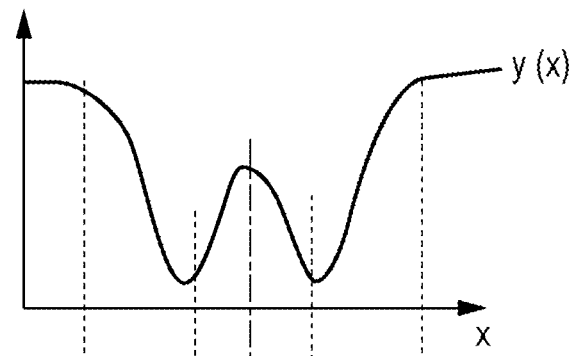
FIGS. 10A, 10B, and 10C illustrate examples of methods of calculating an alignment mark position.
Figure 10B:
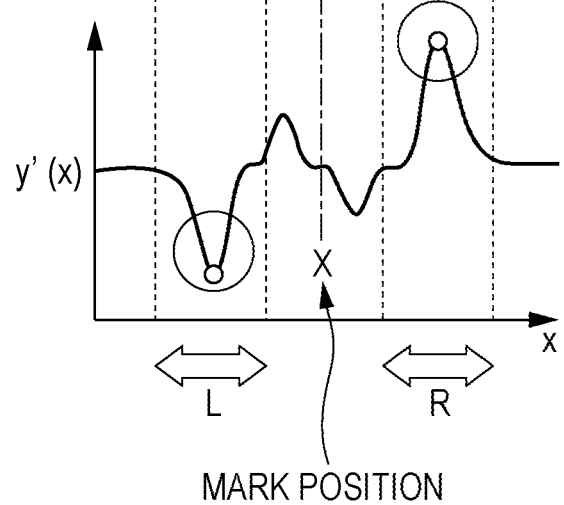
Figure 10C:
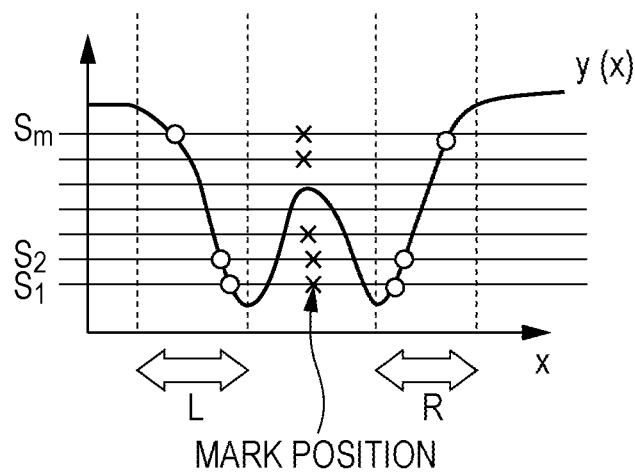

Finally, the calculation unit 163 calculates the position of the alignment mark based on the reconstructed signal f' corrected in step S150 (step S160). Referring to FIGS. 10A, 10B, and 10C, a method of calculating the position of the alignment mark is described below. FIG. 10A illustrates image data y(x) obtained in detecting an alignment mark of interest. An interval L and an interval R are defined in the image data y(x) and random noise is removed. An x coordinate is determined for a point at which the first derivative y'(x) of y(x) has a minimum value in the interval L, and an x coordinate is determined for a point at which the first derivative y'(x) of y(x) has a maximum value in the interval R, and then the midpoint between these two coordinates is employed as the position of the mark (FIG. 10B). Note that the first derivative signal y'(x) is a discrete signal, and thus values at sub pixels close to the maximum value or the minimum value thereof are determined by interpolation using a functional approximation or the like.

FIG. 10C illustrates another method of calculating the position of an alignment mark. In this method, slice levels such as S1, S2, ..., Sm are defined in image data y(x), and an x coordinate at which the image data y(x) crosses each slice level is determined for respective intervals L and R. The midpoint of two intersection points one of which is located in the interval L and the other in the interval R is determined for each slice level. Finally, the average value of x coordinates of the midpoints of the respective slice levels, and the resultant value is employed as the mark position. In the determination of the intersection between the image data y(x) and each slice level, the value of the image data is determined from discrete image data values by linear interpolation whereby the x coordinate of the intersection is determined with an error on the order of sub pixels. The method is not limited to those described above with reference to FIG. 10B or 10C, but many other methods may be used. For example, a pattern matching method may be used to detect the mark position.

Next, based on the calculated alignment mark position, a wafer alignment process is performed (step S170). A wafer exposure process is then performed (step S180).

Figure 11A:
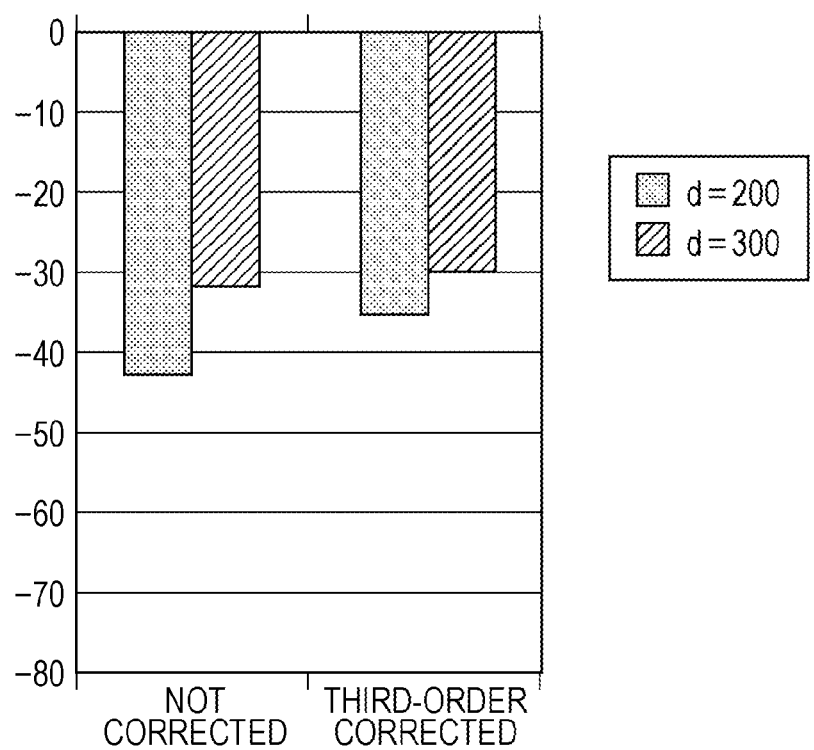
FIG. 11A illustrates detected alignment mark positions with and without a correction using a reconstruction filter.
Figure 11B:
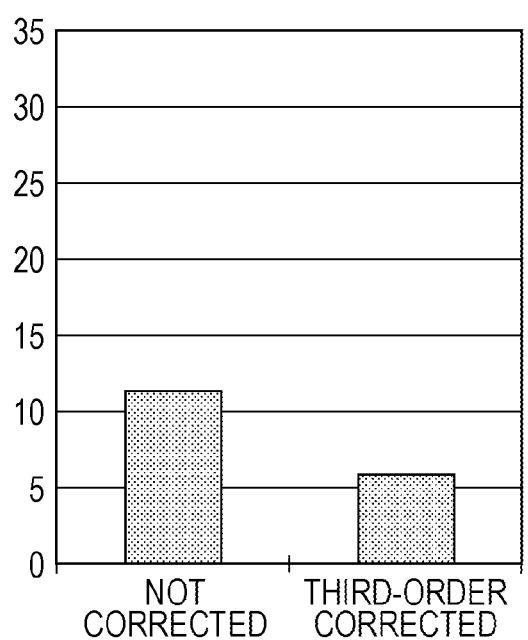
FIG. 11B illustrates differences in detected alignment mark positions between different mark step heights with and without a correction.

FIG. 11A illustrates positions of alignment marks with two step heights shown in FIG. 6, obtained by performing a correction using the reconstruction filter shown in FIG. 9A on alignment mark image data and also those obtained without performing the correction. FIG. 11B illustrates differences in mark position between two mark step heights, for the corrected and non-corrected cases. As can be seen from FIG. 11B, by performing the correction on the image data according to the present embodiment of the invention, it becomes possible to achieve smaller dependence of the mark step height on the detected mark position, that is, it is possible to achieve robustness against the wafer process variation.

Let $\theta(k)$ denote the phase of the Fourier transform of the digital signal f(k) (k=0, . . . , N–1), As denote the sampling interval, N denote the number of samples, and $\Delta f$ denote the frequency resolution. $\Delta f$, $\Delta s$, and N are related to each other according to equation (5).

$$\Delta f = \frac{1}{N \cdot \Delta s} \quad (5)$$

In the present embodiment, the phase characteristic is expressed by a corresponding position shift $\Delta\phi$ in real space given by equation (6).

$$\Delta\varphi = \frac{\theta(k)}{2\pi k \Delta f} = \frac{\theta(k) \cdot N \cdot \Delta s}{2\pi \cdot k} \quad (6)$$

The correction of image data in step S150 may not be performed. Instead, the alignment mark position shift may be determined from the phase characteristic of the harmonic frequency that have the least phase characteristic difference among the first-order to the third-order harmonic frequencies, and the alignment may be performed based on this value. However, in practice, the image data is sampled in the measurement direction at finite sampling intervals ($\Delta s$). In a case where a sufficiently high spatial resolution is not obtained due to the limitation on the sampling interval, it is difficult to obtain high frequency resolution $\Delta f$ after the Fourier transform is performed, as can be seen from equation (6). This can cause an error in harmonic frequency. Therefore, if the position shift is evaluated only based on the phase characteristic at the harmonic frequency at which the phase characteristic difference is the least of all harmonic frequencies, there is a possibility that it is difficult to achieve necessary accuracy on the order of sub pixels. For the above reason, the calculation of the mark position based on the image data corrected in the spatial axis using the reconstruction filter in step S150 makes it possible to achieve high accuracy in the mark position detection on the order of sub pixels.

In the present embodiment, the phase characteristic is taken into account for only the first-order, the second-order, and third-order harmonic frequencies. However, in the signal correction, differences in phase characteristic at higher-order harmonic frequencies may be calculated and compared with the phase characteristics at the first-order to the third-order harmonic frequencies.

As described above, when the optical system has aberrations such as a coma aberration, an interaction between an alignment mark structure and a wafer-induced sift (WIS) can occur and this can cause image data to be deformed, which can cause an error to occur in detection of an alignment mark position.

In the present embodiment, image data is first corrected and then the alignment mark position detection is performed using the corrected image data to achieve high detection accuracy thus high alignment accuracy. That is, in the detection of the mark position, the present embodiment of the invention makes it possible to reduce the influence of the wafer process on the alignment signal.

Second Embodiment

A second embodiment is described below. In this second embodiment, weighting factors $\alpha$ of the reconstruction filter is set depending on the difference in phase characteristic at the harmonic frequencies A1, A2, and A3. When differences in phase characteristic at the three harmonic frequencies shown in FIG. 8D are $\Delta\phi 1$, $\Delta\phi 2$, and $\Delta\phi 3$, the weighting factors are determined based on their reciprocals, i.e., $1/\Delta\phi 1$, $1/\Delta\phi 2$, and $1/\Delta\phi 3$. More specifically, the weighting factors $\alpha 1$, $\alpha 2$, and $\alpha 3$ of the reconstruction filter at the respective harmonic frequencies A1, A2, and A3 are determined according to equation (7) shown below.

$$\begin{cases} \alpha_1 = \frac{1/\Delta\varphi_1}{1/\Delta\varphi_1 + 1/\Delta\varphi_2 + 1/\Delta\varphi_3} \\ \alpha_2 = \frac{1/\Delta\varphi_2}{1/\Delta\varphi_1 + 1/\Delta\varphi_2 + 1/\Delta\varphi_3} \\ \alpha_3 = \frac{1/\Delta\varphi_3}{1/\Delta\varphi_1 + 1/\Delta\varphi_2 + 1/\Delta\varphi_3} \end{cases} \quad (7)$$

Figure 12A:
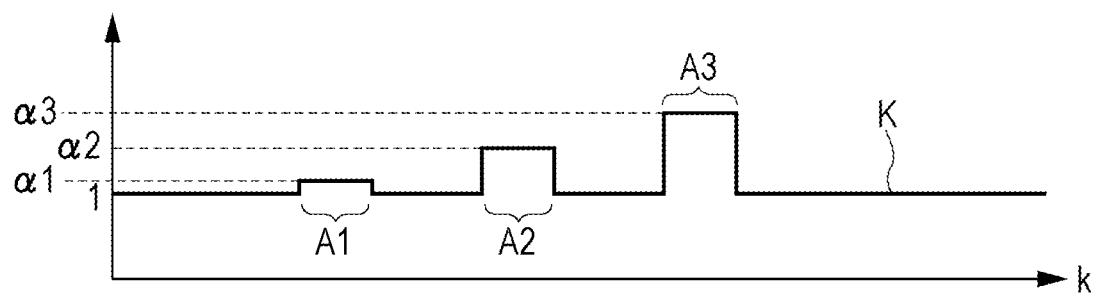
FIGS. 12A and 12B illustrate examples of reconstruction filters.
Figure 12B:
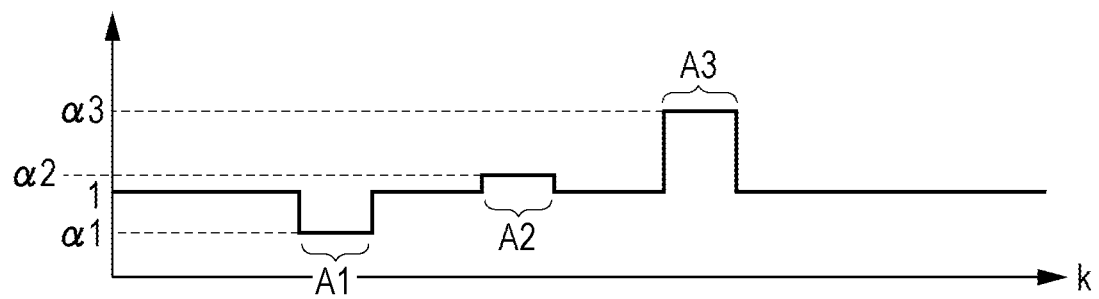

FIG. 12A illustrates an example of a reconstruction filter K weighted according to equation (7). In the example shown in FIG. 12A, the weighting factors $\alpha$ of the reconstruction filter are all set to be greater than 1. However, the weighting factors $\alpha$ do not need to be greater than 1. In an example shown in FIG. 12B a weighting factor $\alpha$ is set to be smaller than 1 for a harmonic frequency at which a difference in phase characteristic is large. This makes it possible to reduce the influence of a frequency component having a large phase characteristic difference (the first-order harmonic frequency in the present example) compared with the other frequency components.

Note that in the first embodiment described above, the weighting factors are set to 1 except for the weighting factor of the harmonic frequency having the least phase characteristic difference.

The present embodiment makes it possible to set the reconstruction filter in many different manners to improve the accuracy in the alignment mark position detection.

Third Embodiment

In a third embodiment, three different heights of the mark step are taken into account. For example, when d denotes a standard value of the mark step height, if the height of the mark step can have a shift of $\Delta d$ from the standard value due to a variation in wafer process condition, then the three values of the step height may be given as follows.

$$\begin{cases} d1 = d - \Delta d \\ d2 = d \\ d3 = d + \Delta d \end{cases} \quad (8)$$

Figure 13:
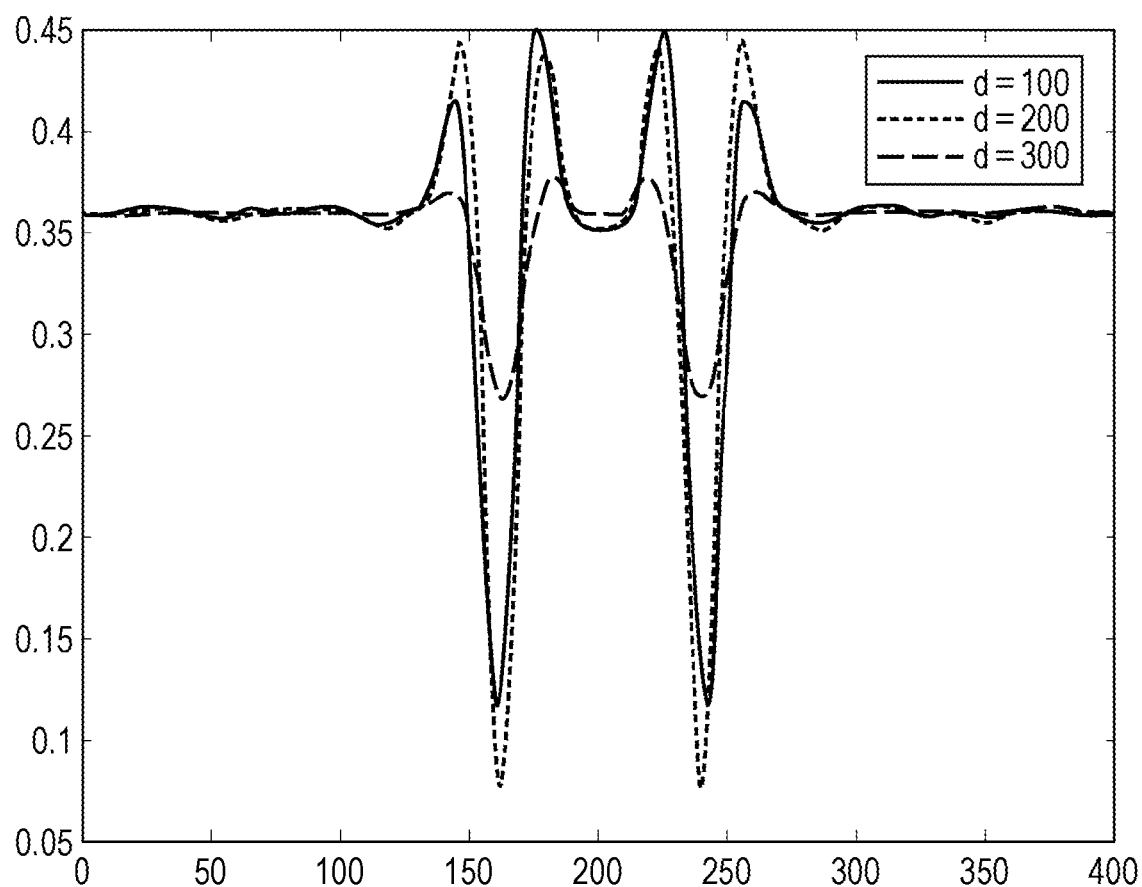
FIG. 13 illustrates examples of simulated image data of three marks with different step heights.

FIG. 13 illustrates image data simulated for three different mark step heights d1=100 nm, d2=200 nm, and d3=300 nm.

In this signal simulation, the alignment mark size, σ of the illumination system, and NA of the optical system are set to be equal to those in the first embodiment. However, aberration information is not equal to that used in the first embodiment, but measured values obtained in another different alignment optical system of an exposure apparatus are employed.

Figure 14A:
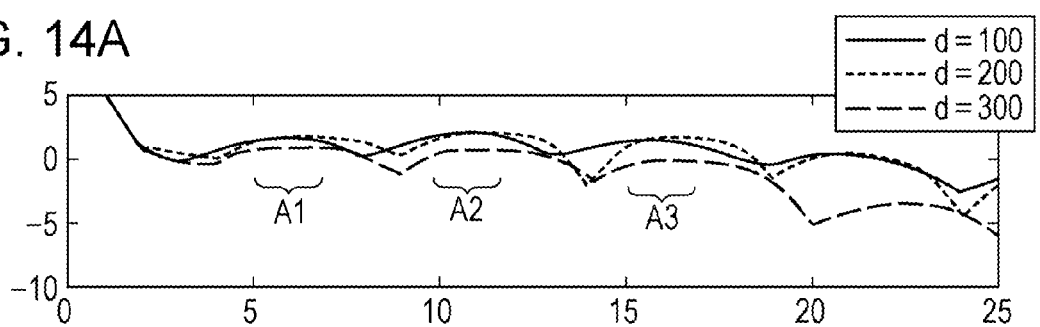
FIG. 14A illustrates amplitude characteristics of Fourier transforms of detection signals simulated for three marks having different step heights.
Figure 14B:
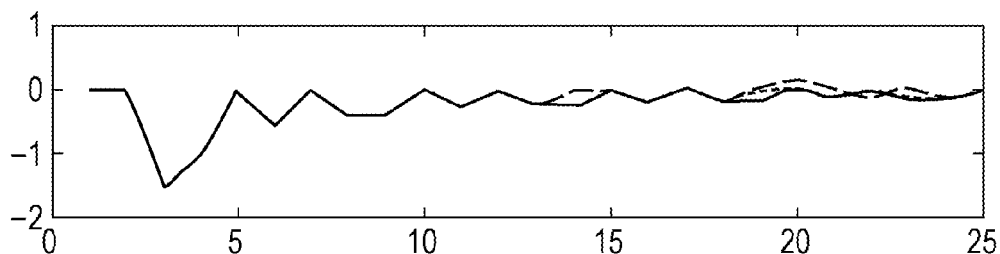
FIG. 14B illustrates phase characteristics of Fourier transforms of detection signals simulated for three marks having different step heights.
Figure 14C:
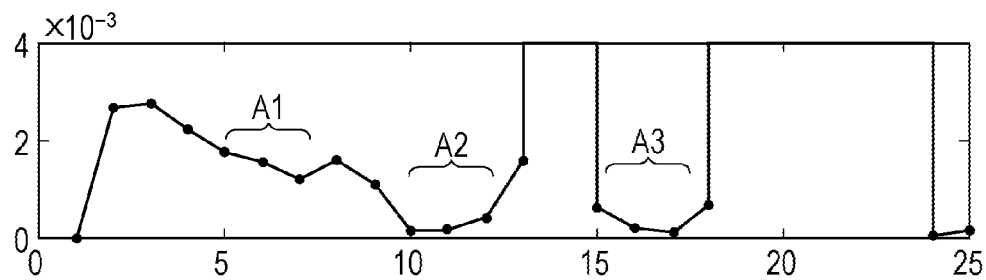
FIG. 14C illustrates a difference in phase characteristic.

FIG. 14A illustrates amplitude characteristics of the Fourier transform of the simulated detection signals calculated for three different mark step heights, and FIG. 14B illustrates phase characteristics thereof. FIG. 14C illustrates differences in phase characteristics among mark step heights determined from the phase characteristics shown in FIG. 14B (difference between the maximum value and the minimum value of phase characteristics among the three mark step heights). As shown in FIG. 14C, among first-order, second-order, and third-order harmonic frequencies, the second-order harmonic frequency has the least difference in phase characteristic caused by the difference in step height.

Figure 14D:
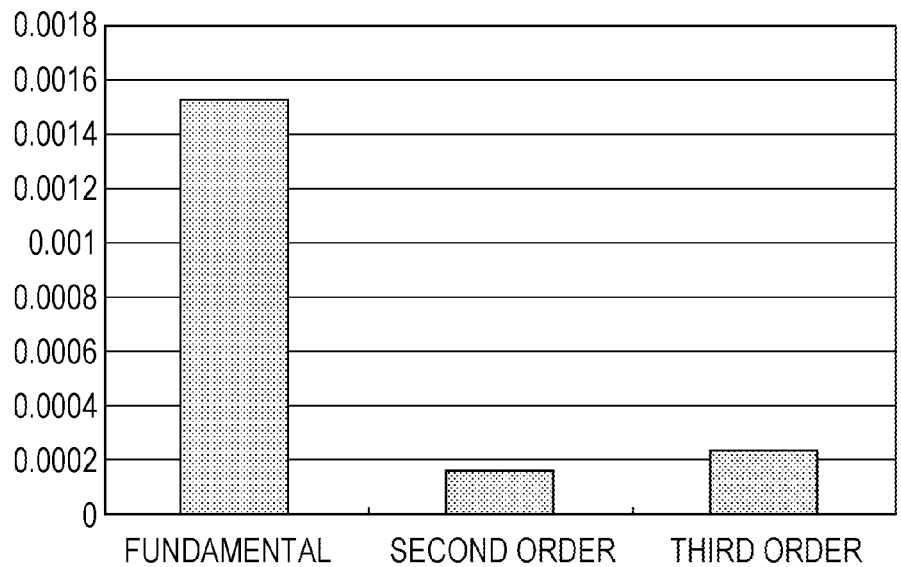
FIG. 14D illustrates an average difference in phase characteristic.

FIG. 14D illustrates differences in phase characteristics averaged in each bands A1, A2, and A3. The difference in phase characteristics is the least at the second-order harmonic frequency, and thus a weighting factor may be set to the amplitude characteristic at the second-order harmonic frequency. More specifically, the calculation unit 163 corrects the image data using a reconstruction filter such as that shown in FIG. 9B, and calculates the alignment mark position in a similar manner to the first embodiment.

Figure 15A:
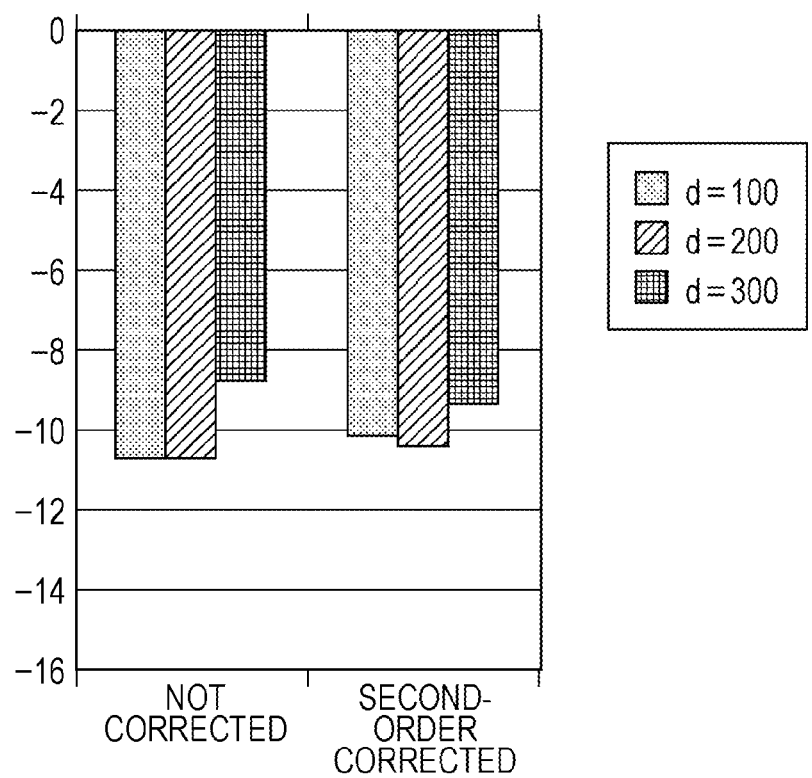
FIG. 15A illustrates detected alignment mark positions with and without a correction using a reconstruction filter.
Figure 15B:
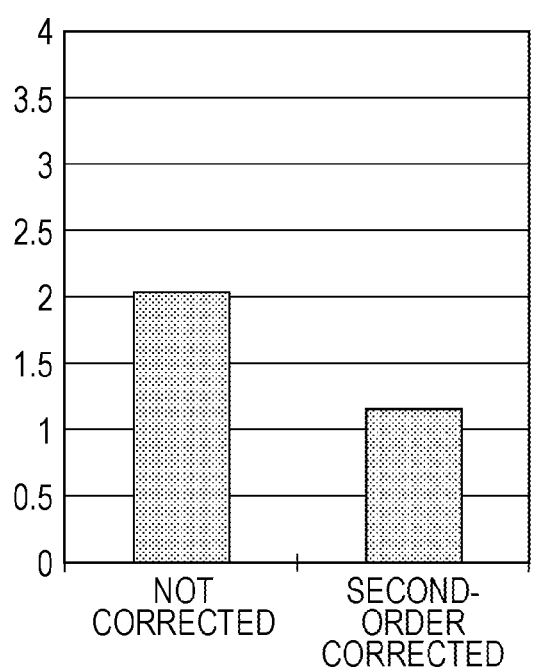
FIG. 15B illustrates differences in detected alignment mark positions between different mark step heights with and without a correction.

FIG. 15A illustrates alignment mark positions calculated from the image data with three different mark step heights by employing the data corrected using the reconstruction filter shown in FIG. 9B, and also illustrates alignment mark positions obtained when no correction of the image data is performed. FIG. 15B illustrates differences in mark position caused by differences in mark step heights, for the corrected and non-corrected cases. As can be seen from FIG. 15B, by performing the correction on the image data according to the present embodiment of the invention, it becomes possible to achieve a smaller variation in mark position caused by the difference in mark step height, that is, it is possible to achieve robustness against the wafer process variation.

In the present embodiment, by taking into account a greater number of different heights of the mark step, the reconstruction filter is set in a more proper manner, which makes it possible to achieve higher accuracy in the mark position detection.

Fourth Embodiment

Figure 16:
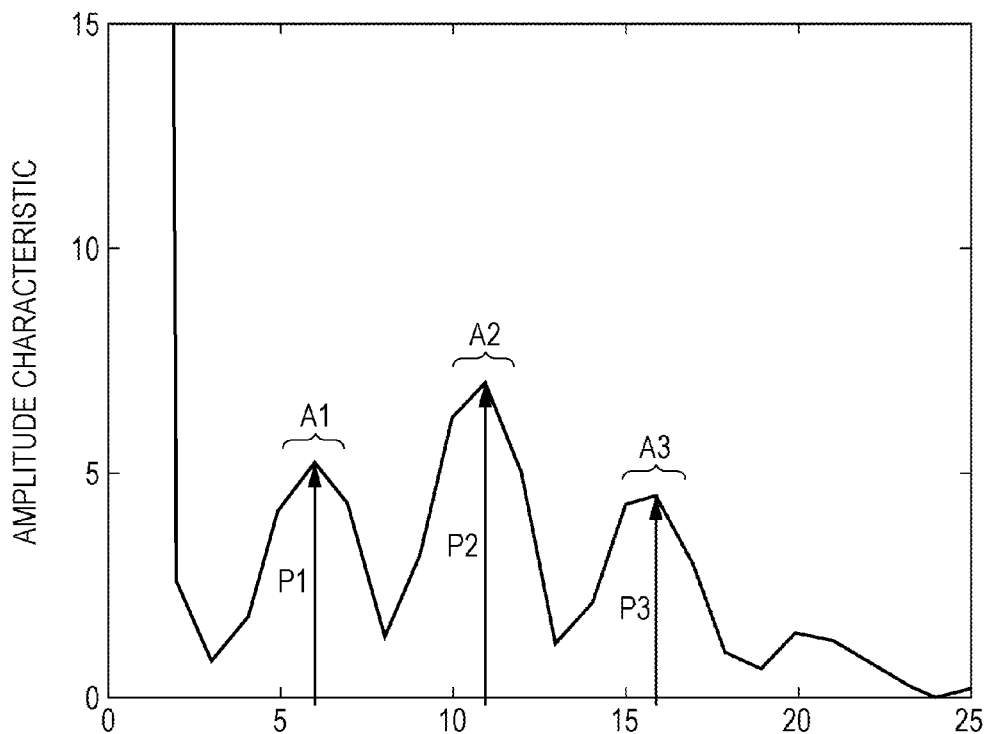
FIG. 16 illustrates an amplitude characteristic of Fourier transform of image data.

In a fourth embodiment described below, weighting of the reconstruction filter is determined based on a factor other than the phase characteristic difference. For example, when the amplitude characteristic of the Fourier transform of image data is given as shown in FIG. 16, let P1, P2, and P3 be the amplitudes at the respective harmonic frequencies A1, A2, and A3. The coefficients α1, α2, and α3 of the reconstruction filter may be set based on their reciprocals, i.e., 1/P1, 1/P2, and 1/P3. That is, the reconstruction filter is set based on the amplitude characteristics at the harmonic frequencies. More specifically, the coefficients α1, α2, and α3 of the reconstruction filter at the respective harmonic frequencies A1, A2, and A3 are determined according to equation (9) shown below.

$$\begin{cases} \alpha_1 = \dfrac{1/P_1}{1/P_1 + 1/P_2 + 1/P_3} \\ \alpha_2 = \dfrac{1/P_2}{1/P_1 + 1/P_2 + 1/P_3} \\ \alpha_3 = \dfrac{1/P_3}{1/P_1 + 1/P_2 + 1/P_3} \end{cases} \quad (9)$$

Alternatively, the reconstruction filter may be set based on a variation in amplitude characteristic at the harmonic frequencies caused by a variation in a wafer process condition. For example, when shifts ΔP1, ΔP2, and ΔP3 occur in amplitude characteristic at harmonic frequencies due to a variation in mark step height caused by a variation in a wafer process condition, the coefficients α1, α2, and α3 of the reconstruction filter may be determined based on their reciprocals, i.e., 1/ΔP1, 1/ΔP2, and 1/ΔP3. More specifically, the coefficients α1, α2, and α3 of the reconstruction filter at the respective harmonic frequencies A1, A2, and A3 may be determined according to equation (10) shown below.

$$\begin{cases} \alpha_1 = \dfrac{1/\Delta P_1}{1/\Delta P_1 + 1/\Delta P_2 + 1/\Delta P_3} \\ \alpha_2 = \dfrac{1/\Delta P_2}{1/\Delta P_1 + 1/\Delta P_2 + 1/\Delta P_3} \\ \alpha_3 = \dfrac{1/\Delta P_3}{1/\Delta P_1 + 1/\Delta P_2 + 1/\Delta P_3} \end{cases} \quad (10)$$

Fifth Embodiment

In a fifth embodiment described below, a plurality of marks with different step heights are produced by performing an etching process in a wafer, and coefficients of the reconstruction filter are determined based on actual measurement results of the marks.

Figure 17:
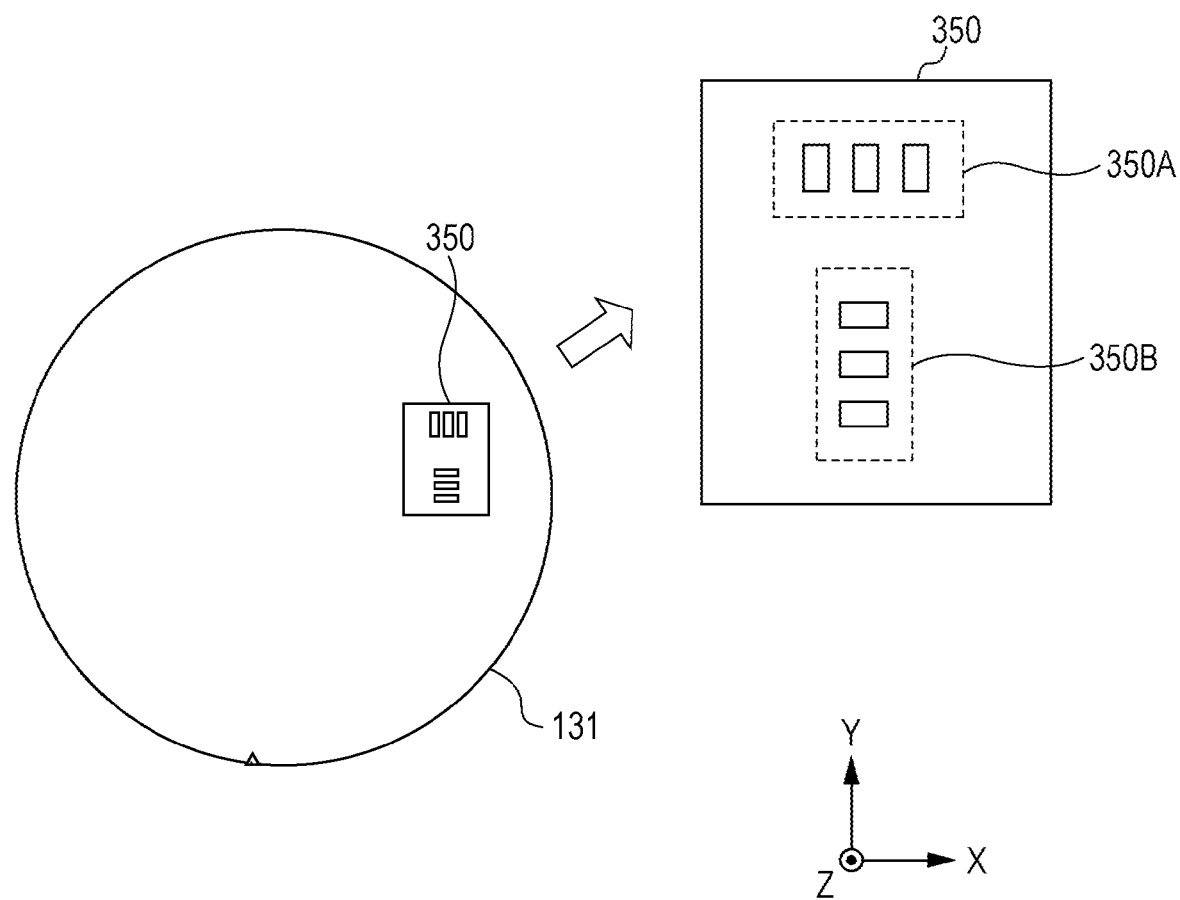
FIG. 17 is a schematic plan view of a silicon (Si) wafer having a test mark formed thereon.

FIG. 17 is a plan view schematically illustrating a Si wafer 131 on which a test mark 350 is formed. Light reflected from the test mark 350 is focused into an image by the mark detection system 150 and sensed by the sensors 156 and 157 in a similar manner to alignment marks formed on the wafer. The test mark 350 includes a test mark 350A for measurement in the X direction and a test mark 350B for measurement in the Y direction. Note that the test mark 350B for use in measurement in the Y direction has a shape equal to that obtained by rotating the test mark element 350A for use in measurement in the X direction by 90 degrees about a Z axis. The test mark 350A for use in measurement in the X direction is described in further detail below with reference to FIGS. 18A and 18B.

Figure 18A:
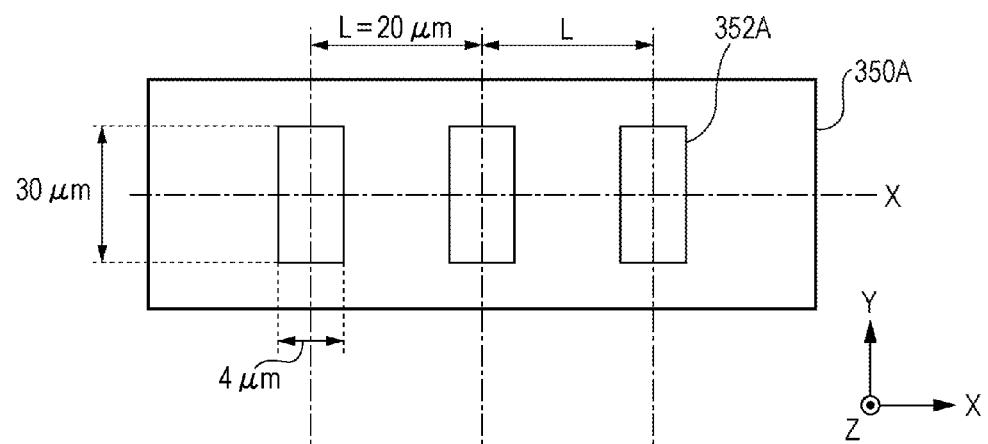
FIG. 18A is a plan view of a test mark for use in measurement in an X direction.

FIG. 18A is a plan view of the test mark 350A for use in measurement in the X direction. In the present example, the test mark 350A includes three mark elements 352A which are different in step height and which are arranged at equal intervals in the measurement direction. The test mark 350A has a shape in plan view equal to that of the alignment mark 180A shown in FIG. 3A. In the test mark 350A shown in FIG. 18A, the mark element 352A is formed in a similar manner to the mark element 180A of the alignment mark shown in FIG. 3A, that is, the width in the X direction is 4 μm, the width in the Y direction is 30 μm, and the mark elements are arranged in the measurement direction at equal intervals L=20 μm.

Figure 18B:
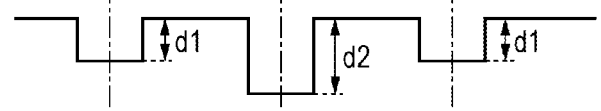
FIG. 18B is a cross-sectional view thereof.

FIG. 18B is a cross-sectional view of the test mark 350A. The step height of each mark element of the test mark 350A is set such that d1=200 nm for the mark element 352A and d2=300 nm for other mark elements. The step heights d1 and d2 are set to proper values taking into account a possible variation in step height due to variations in wafer process conditions as described above with reference to the first embodiment. Information indicating the shape in the plan view and the step height of the test mark is employed as mark shape information.

Figure 19:
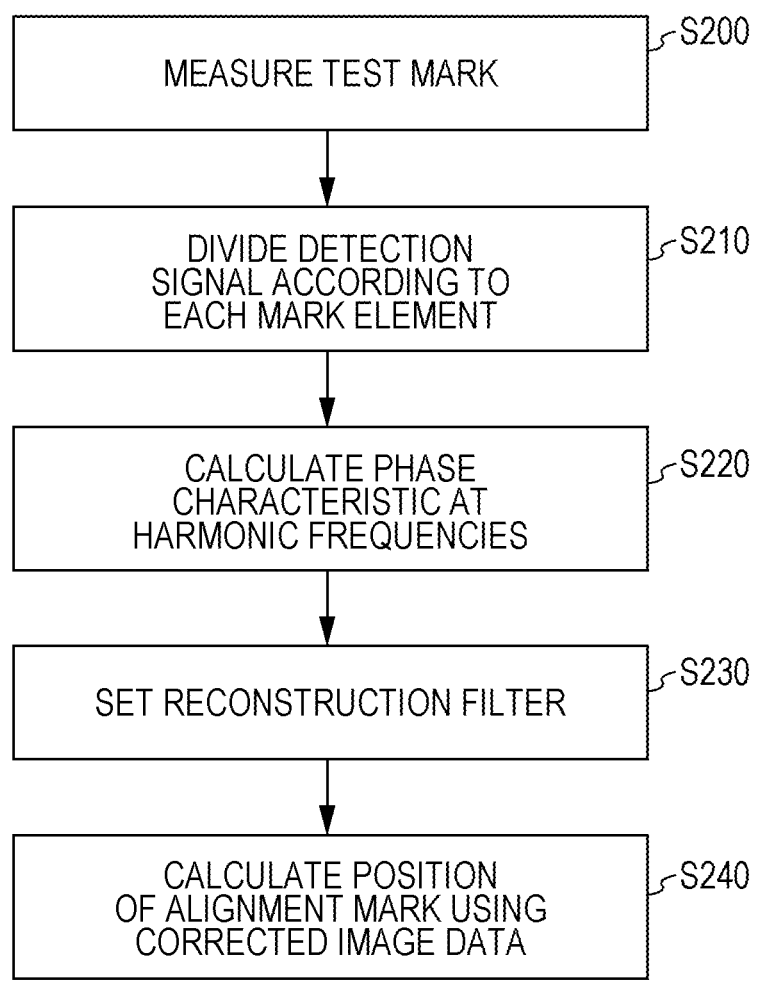
FIG. 19 is a flow chart of signal processing using a test mark.

Next, referring to a flow chart shown in FIG. 19, a method of signal processing associated with the test mark is described below. First, the test mark is measured using the mark detection system 150 (step S200). Next, image data of the test mark is divided into three mark elements (step S210). In a case where the designed value of the interval between mark elements is L, the image data of the test mark may be divided at intervals of L. Each of the three divided image data of the test mark is subjected to the Fourier transform and the phase characteristic thereof is calculated. The difference in phase characteristic among the harmonic frequencies is then calculated (step S220). In the case where the test mark is divided into three parts, the range from the minimum value to the maximum value of the three phase characteristics at each harmonic frequency is employed as the difference in phase characteristic.

Next, based on the difference in phase characteristic calculated in step S220, coefficients of the reconstruction filter are set (step S230). The coefficients of the reconstruction filter may be set in a similar manner to the previous embodiments. The actual image data is corrected using the reconstruction filter set in the above-described manner. In the case where the actual image data includes a plurality of mark elements, the correction is performed for each mark element. Finally, the mark position is calculated using the corrected image data (step S240).

In the case where the alignment mark includes a plurality of mark elements, the positions of the respective mark elements may be calculated in step S240 and the average value thereof may be employed as the alignment mark position.

In the embodiments described above, the influence of the variation in the mark step height caused by variations in wafer process conditions has been discussed. However, the embodiments may also be applicable to handle variations in other factors in the wafer process, such as a variation in resist thickness. To handle the variation in resist thickness, a standard resist thickness in the wafer process is defined by Rt, and two resist thicknesses R1 and R2 are set taking into account a possible variation in thickness due to variations in wafer process conditions.

$$\begin{cases} R1 = Rt - \Delta Rt \\ R2 = Rt + \Delta Rt \end{cases} \quad (11)$$

By incorporating the two resist thicknesses R1 and R2 into the calculation, it is possible to perform the correction as in the first embodiment.

Alternatively, three resist thicknesses may be employed as follows.

$$\begin{cases} R1 = Rt - \Delta Rt \\ R2 = Rt \\ R3 = Rt + \Delta Rt \end{cases} \quad (12)$$

By incorporating the three resist thicknesses R1, R2, and R3 into the calculation, it is possible to perform the correction as in the second embodiment. It is also possible to handle both a variation in resist thickness and a variation in mark step height as variations in wafer process conditions.

Furthermore, the mark detection is not limited to the detection of the alignment mark by the exposure apparatus. For example, the embodiments are also applicable to detections of various types of measurement marks such as a registration check mark used by a registration inspection apparatus.

Next, a description is given below as to a method of producing a device (such as a semiconductor integrated circuit device, a liquid crystal display device, etc.) using the exposure apparatus described above. The process of producing the device includes exposing a substrate (a wafer, a glass substrate, etc.) coated with a photosensitive material by using the exposure apparatus described above, developing the substrate (the photosensitive material), and other processing steps such as etching, resist removing, dicing, bonding, packaging, etc. This production method makes it possible to produce devices having higher quality than can be obtained by known methods.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-187128, filed Aug. 24, 2010, which is hereby incorporated by reference herein in its entirety.

What is claimed is:

1. A method comprising:
   acquiring data of an image of a mark formed on a substrate by sensing the image of the mark by a sensor and an imaging optical system;
   setting correction data of a fundamental frequency and a high harmonic of the acquired data based on information associated with a shape of the mark, an imaging magnification of the imaging optical system, and an imaging area of the sensor;
   correcting the acquired data based on the correction data; and
   calculating a position of the mark based on the corrected data.

2. The method according to claim 1, wherein the setting of the correction data includes:
   calculating, in advance by simulation, data of a mark predicted to be formed on the substrate individually for each of a plurality of processing conditions used to form the mark;
   calculating, in advance, phase characteristics of the fundamental frequency and the high harmonic of the data of the mark by using information associated with the shape of the mark, the imaging magnification of the imaging optical system, and the imaging area of the sensor, individually for each of the plurality of processing conditions; and defining the correction data of the fundamental frequency and the high harmonic based on a difference in phase characteristic among the processing conditions.

3. The method according to claim 2, wherein the plurality of processing conditions includes a step height of the mark formed on the substrate.

4. The method according to claim 2, wherein the plurality of processing conditions includes a film thickness of a photosensitive material coated on the substrate.

5. The method according to claim 1, wherein the fundamental frequency is determined based on $k=\Delta p \times N/(\beta \cdot a)$ where k is an integer, a is a length of the mark in a measurement direction, $\beta$ is the imaging magnification of the imaging optical system, $\Delta p$ is a pitch of photosensor elements of the sensor, and N is a number indicating how many pixels there are in the imaging area, and the high harmonic is determined by multiplying k by an integer equal to or greater than 2.

6. A measurement apparatus comprising:
an optical system configured to form an image of a mark in a plane;
a sensor configured to sense the formed image and output data of the sensed image;
a calculation unit configured to calculate a position of the mark; and
a storage unit configured to store correction data of a fundamental frequency and a high harmonic of the output data, the correction data being determined using information associated with a shape of the mark, an imaging magnification of the optical system, and an imaging area of the sensor,
wherein the calculation unit corrects the output data using the correction data and calculates the position of the mark using the corrected data.

7. An exposure apparatus configured to expose a substrate via a mask to light emitted from a light source, comprising:
the measurement apparatus according to claim 6;
a substrate stage configured to hold the substrate; and
a control unit configured to control the substrate stage,
wherein in the exposure of the substrate, the measurement apparatus measures the position of the mark formed on the substrate, and the control unit controls the substrate stage based on a measurement result.

8. A method of producing a device, comprising:
exposing a substrate using the exposure apparatus according to claim 7; and
developing the exposed substrate.

9. A non-transitory computer readable storage medium storing a program for causing a computer to execute the steps of:
correcting data obtained by taking an image of a mark formed on a substrate using an imaging optical system and a sensor, based on correction data of a fundamental frequency and a high harmonic of the obtained data defined based on information associated with a shape of the mark, an imaging magnification of the imaging optical system, and an imaging area of the sensor; and
calculating a position of the mark using the corrected data.

10. A measurement method comprising:
forming an image of a mark in a plane by an optical system;
sensing the formed image and outputting data of the sensed image by a sensor;
determining correction data of a fundamental frequency and a high harmonic of the output data using information associated with a shape of the mark, an imaging magnification of the optical system, and an imaging area of the sensor; and
storing the correction data;
correcting the output data using the correction data; and
calculating a position of the mark using the corrected data.

11. An apparatus comprising:
an acquiring unit configured to acquire data of an image of a mark formed on a substrate by sensing the image of the mark by a sensor and an imaging optical system;
a setting unit configure to set correction data of a fundamental frequency and a high harmonic of the acquired data based on information associated with a shape of the mark, an imaging magnification of the imaging optical system, and an imaging area of the sensor;
a correcting unit configured to correct the acquired data based on the correction data; and
a calculating unit configured to calculate a position of the mark based on the corrected data.

12. A method comprising the following steps executed by a processor:
correcting data obtained by taking an image of a mark formed on a substrate using an imaging optical system and a sensor, based on correction data of a fundamental frequency and a high harmonic of the obtained data defined based on information associated with a shape of the mark, an imaging magnification of the imaging optical system, and an imaging area of the sensor; and
calculating a position of the mark using the corrected data.

* * * * *